(12) United States Patent
Houlihan et al.

(10) Patent No.: US 8,017,296 B2
(45) Date of Patent: Sep. 13, 2011

(54) ANTIREFLECTIVE COATING COMPOSITION COMPRISING FUSED AROMATIC RINGS

(75) Inventors: Francis Houlihan, Millington, NJ (US);
David Abdallah, Bernardsville, NJ (US);
M. Dalil Rahman, Flemington, NJ (US);
Douglas McKenzie, Easton, PA (US);
Ruzhi Zhang, Pennington, NJ (US);
Allen G. Timko, Flemington, NJ (US);
WooKyu Kim, Bridgewater, NJ (US);
Ping-Hung Lu, Bridgewater, NJ (US)

(73) Assignee: AZ Electronic Materials USA Corp., Somerville, NJ (US)

(\*) Notice: Subject to any disclaimer, the term of this patent is extended or adjusted under 35 U.S.C. 154(b) by 211 days.

(21) Appl. No.: 11/872,962

(22) Filed: Oct. 16, 2007

(65) Prior Publication Data

US 2008/0292995 A1    Nov. 27, 2008

Related U.S. Application Data

(63) Continuation-in-part of application No. 11/752,040, filed on May 22, 2007, now abandoned.

(51) Int. Cl.
*G03F 7/04* (2006.01)
(52) U.S. Cl. .................. 430/270.1; 422/40
(58) Field of Classification Search .............. 422/40; 430/270.1
See application file for complete search history.

(56) References Cited

U.S. PATENT DOCUMENTS

| | | | |
|---|---|---|---|
| 3,474,054 A | 10/1969 | White | |
| 3,474,058 A | 10/1969 | Ridgeway et al. | |
| 4,200,729 A | 4/1980 | Calbo | |
| 4,251,665 A | 2/1981 | Calbo | |
| 4,463,162 A | 7/1984 | Nogami et al. | |
| 4,491,628 A | 1/1985 | Ito et al. | |
| 4,719,166 A | 1/1988 | Blevins et al. | |
| 5,187,019 A | 2/1993 | Calbo et al. | |
| 5,294,680 A | 3/1994 | Knors et al. | |
| 5,350,660 A | 9/1994 | Urano et al. | |
| 5,607,824 A | 3/1997 | Fahey et al. | |
| 5,688,598 A | 11/1997 | Keck et al. | |
| 5,747,599 A | 5/1998 | Ohnishi | |
| 5,843,624 A | 12/1998 | Houlihan et al. | |
| 5,935,760 A | 8/1999 | Shao et al. | |
| 5,965,679 A | 10/1999 | Godschalx et al. | |
| 5,981,145 A | 11/1999 | Ding et al. | |
| 6,048,956 A | 4/2000 | Muto et al. | |
| 6,121,495 A | 9/2000 | Babb et al. | |
| 6,165,684 A | 12/2000 | Mizutani et al. | |
| 6,228,552 B1 | 5/2001 | Okino et al. | |
| 6,255,394 B1 | 7/2001 | Onizawa | |
| 6,268,072 B1 | 7/2001 | Zheng et al. | |
| 6,316,165 B1 | 11/2001 | Pavelchek et al. | |
| 6,410,208 B1 | 6/2002 | Teng | |
| 6,447,980 B1 | 9/2002 | Rahman et al. | |
| 6,723,488 B2 | 4/2004 | Kudo et al. | |
| 6,737,492 B2 | 5/2004 | Kang et al. | |
| 6,783,916 B2 | 8/2004 | Foster et al. | |
| 6,790,587 B1 | 9/2004 | Feiring et al. | |
| 6,818,258 B2 | 11/2004 | Kaneko et al. | |
| 6,849,377 B2 | 2/2005 | Feiging et al. | |
| 6,866,984 B2 | 3/2005 | Jung et al. | |
| 6,899,963 B1 | 5/2005 | Zheng et al. | |
| 6,916,590 B2 | 7/2005 | Kaneko et al. | |
| 7,132,216 B2 | 11/2006 | Shao et al. | |
| 7,214,743 B2 | 5/2007 | Hatakeyama et al. | |
| 7,303,855 B2 | 12/2007 | Hatakeyama et al. | |
| 7,749,681 B2 | 7/2010 | Yoshimura et al. | |
| 7,816,071 B2 | 10/2010 | Abdallah et al. | |
| 7,932,018 B2 | 4/2011 | McKenzie et al. | |
| 2001/0006759 A1 | 7/2001 | Shipley et al. | |
| 2002/0094382 A1 | 7/2002 | Imai et al. | |
| 2003/0180559 A1 | 9/2003 | Wayton et al. | |
| 2004/0219453 A1 | 11/2004 | Pavelchek et al. | |
| 2005/0007016 A1 | 1/2005 | Mori et al. | |
| 2005/0058929 A1 | 3/2005 | Kennedy et al. | |
| 2005/0095434 A1 | 5/2005 | Hirota et al. | |
| 2005/0186444 A1 | 8/2005 | Zheng et al. | |
| 2005/0282091 A1 | 12/2005 | Hatakeyama | |
| 2006/0177774 A1 | 8/2006 | Abdallah et al. | |
| 2006/0204891 A1 | 9/2006 | Hatakeyama et al. | |
| 2006/0222999 A1 | 10/2006 | Miyazaki et al. | |
| 2006/0234158 A1 | 10/2006 | Hatakeyama | |
| 2006/0275696 A1 | 12/2006 | Zampini et al. | |
| 2007/0057253 A1 | 3/2007 | Gronbeck et al. | |
| 2007/0287298 A1 | 12/2007 | Ishibashi et al. | |
| 2008/0160461 A1 | 7/2008 | Yoon et al. | |
| 2008/0305441 A1 | 12/2008 | Yoon et al. | |
| 2009/0176165 A1 | 7/2009 | Cheon et al. | |

(Continued)

FOREIGN PATENT DOCUMENTS

EP   0 845 486 A1   6/1998

(Continued)

OTHER PUBLICATIONS

Machine Language English Abstract and Translation from JPO of JP 11-249311 A.
English Language Abstract from EPO of JP 62-230843 A.
English Language Abstract from EPO of JP 2002-014474 A.
Machine Language English Abstract and Translation from JPO of JP 2002-014474 A.
English Language Abstract of XP002503793 retrieved from STN Database accession No. 1999:587958, Database CA [Online] Chemical Abstracts Services, Columbus, Ohio, USA, (Sep. 20, 1999).
English Language Abstract of XP002503795 retrieved from Database WPI Week accession No. 1999-57548 [49], Thomson Scientific, London, GB.
English Language Abstract of XP0025003794 retrieved from STN Database Accession No. 1988: 205733, Database CA [Online] Chemical Abstracts Services, Columbus, Ohio, USA, (Jun. 11, 1998).

(Continued)

*Primary Examiner* — Sean E Conley
(74) *Attorney, Agent, or Firm* — Sangya Jain

(57) ABSTRACT

The present invention relates to an organic spin coatable antireflective coating composition comprising a polymer comprising at least one unit with 3 or more fused aromatic rings in the backbone of the polymer and at least one unit with an aliphatic moeity in the backbone of the polymer. The invention further relates to a process for imaging the present composition.

25 Claims, 3 Drawing Sheets

U.S. PATENT DOCUMENTS

| | | |
|---|---|---|
| 2009/0246691 A1 | 10/2009 | Rahman et al. |
| 2009/0280435 A1 | 11/2009 | McKenzie et al. |
| 2010/0119979 A1 | 5/2010 | Rahman et al. |
| 2010/0119980 A1 | 5/2010 | Rahman et al. |
| 2010/0151392 A1 | 6/2010 | Rahman et al. |
| 2010/0316949 A1 | 12/2010 | Rahman et al. |
| 2011/0151376 A1 | 6/2011 | Rahman et al. |

FOREIGN PATENT DOCUMENTS

| | | |
|---|---|---|
| EP | 0 933 681 A1 | 8/1999 |
| EP | 1 085 529 A2 | 3/2001 |
| EP | 1 088 875 A2 | 4/2001 |
| EP | 1 705 519 A2 | 9/2006 |
| EP | 1 829 942 A1 | 9/2007 |
| EP | 1 845 416 A2 | 10/2007 |
| JP | 62-230843 | 10/1987 |
| JP | 63-51419 A | 3/1988 |
| JP | 8-73570 A | 3/1996 |
| JP | 8-301980 A | 11/1996 |
| JP | 10-273635 A | 10/1998 |
| JP | 11-249311 A | 9/1999 |
| JP | 2002-14474 A | 1/2002 |
| JP | 2003-82070 A | 3/2003 |
| JP | 2004-205676 A | 7/2004 |
| JP | 2005-43471 A | 2/2005 |
| JP | 2009-14816 A | 1/2009 |
| WO | WO 2008/082241 A1 | 7/2008 |
| WO | WO 2008/120855 A1 | 10/2008 |

OTHER PUBLICATIONS

English Language Abstract of XP002504600 retrieved from STN Database Accession No. 2002:47842, Database CA [Online] Chemical Abstracts Services, Columbus, Ohio, USA, (Jan. 18, 2002).
Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB2008/001284.
Complete set of specification papers for U.S. Appl. No. 12/115,776, filed May 6, 2008 with cover page.
Complete set of specification papers for U.S. Appl. No. 12/060,307, filed Apr. 1, 2008 with cover page.
Complete set of specification papers for U.S. Appl. No. 12/270,189, filed Nov. 13, 2008 with cover page.
Complete set of specification papers for U.S. Appl. No. 12/270,256, filed Nov. 13, 2008 with cover page.
Complete set of specification papers for U.S. Appl. No. 12/332,501, filed Dec. 11, 2008 with cover page.
Office Action dated Mar. 6, 2009 from U.S. Appl. No. 11/752,040.
H. Harada et al., "Progress of Hard Mask Material for Multi-layer stack application", SPIE vol. 6519, pp. 65190N-1-pp. 65190N-9 (2007).
English Language Abstract of JP 63-51419 A.
English Language Abstract of JP 2003-82070 A.
English Language Abstract of JP 2005-43471 A.
Nishimura et al., "Comparison of single-, bi-, and tri-layer resist process", SPIE vol. 5753, pp. 611-pp. 618, 2005.
Office Action mail date Dec. 23, 2009 for U.S. Appl. No. 12/115,776.
Office Action mail date Dec. 7, 2009 for U.S. Appl. No. 12/060,307.
Form PCT/IB/326, Form PCT/IB/373, and Form PCT/ISA/237 for PCT/IB2008/001284 dated Dec. 3, 2009 which corresponds to U.S. Appl. No. 11/872,962.
Form PCT/ISA/220, Form PCT/ISA/210, and Form PCT/ISA/237 for PCT/IB2009/005147 dated Jul. 22, 2009 which corresponds to U.S. Appl. No. 12/115,776.
Form PCT/ISA/220, Form PCT/ISA/210, and Form PCT/ISA/237 for PCT/IB2009/005186 dated Jul. 14, 2009 which corresponds to U.S. Appl. No. 12/270,189.
Form PCT/ISA/220, Form PCT/ISA/210, and Form PCT/ISA/237 for PCT/IB2009/005185 dated Jul. 14, 2009 which corresponds to U.S. Appl. No. 12/270,256.
Guo, et al., "Nanoimprint Lithography: Methods and Material Requirements", Advanced Materials, vol. 19, No. 4, pp. 495-pp. 813, published online Jan. 25, 2007 at http://www3.interscience.wiley.com/journal/114096023/abstract.
U.S. Appl. No. 12/482,189, filed Jun. 10, 2009, Rahman et al.
U.S. Appl. No. 12/646,191, filed Dec. 23, 2009, Rahman et al.
Derwent Abstract of JP 10-273635 A generated May 17, 2010.
Office Action mail date Jul. 12, 2010 for U.S. Appl. No. 12/115,776.
Office Action mail date May 26, 2010 for U.S. Appl. No. 12/060,307.
Office Action mail date Aug. 5, 2010 for U.S. Appl. No. 12/270,189.
387673, epoxy/hydroxyl functaionalized average MW-2.600, average mn-1,300, from http://www.sigmaaldrich.com/catalog/ProductDetail.do?lang=en&N4=387673|ALDRICH&N5=SEARCH_..., printed our May 24, 2010, 2 pages From SIGMA-ALDRICH catalog online.
Guo, et al., "Nanoimprint Lithography: Methods and Material Requirements", Advanced Materials, vol. 19, pp. 495-pp. 513, 2007.
Communication pursuant to Article 94(3) EPC (EPO Form 2001) for EP 08 751 011.1 dated Aug. 11, 2010, which corresponds to U.S. Appl. No. 11/872,962.
Notice of Allowance and Fee(s) Due dated Oct. 1, 2010 for U.S. Appl. No. 12/060,307.
Office Action mail date Oct. 8, 2010 for U.S. Appl. No. 12/270,256.
Form PCT/ISA/220, Form PCT/ISA/210, and Form PCT/ISA/237 for PCT/IB2010/001401 dated Sep. 23, 2010, which corresponds to U.S. Appl. No. 12/482,189.
Communication pursuant to Article 94(3) EPC (EPO Form 2001) for EP 08 751 011.1 dated Mar. 25, 2010, which corresponds to U.S. Appl. No. 11/872,962.
Form PCT/IB/326, Form PCT/IB/373, and Form PCT/ISA/237 for PCT/IB2009/005147 dated Nov. 18, 2010, which corresponds to U.S. Appl. No. 12/115,776.
Office Action dated Nov. 9, 2010 for U.S. Appl. No. 12/332,501.
Notice of Allowance and Fee(s) Due dated Dec. 23, 2010 for U.S. Appl. No. 12/115,776.
Notice of Allowance and Fee(s) Due date mailed Mar. 25, 2010 U.S. Appl. No. US 12/060,307.
Final Office Action mail date Mar. 22, 2011 for U.S. Appl. No. 12/270,189.
Office Action dated Jan. 14, 2011 for U.S. Appl. No. 12/270,256.
Office Action dated Dec. 23, 2010 for U.S. Appl. No. 12/482,189.
Communication pursuant to Article 94(3) EPC for EP 09 742 415.4 dated May 20, 2011, which corresponds to U.S. Appl. No. 12/115,776.
Form PCT/IB/326, Form PCT/IB/373, Form PCT/ISA/237 for PCT/IB2009/005186 dated May 26, 2011, which corresponds to U.S. Appl. No. 12/270,189.
Form PCT/IB/326, Form PCT/IB/373, Form PCT/ISA/237 for PCT/IB2009/005185 dated May 26, 2011, which corresponds to U.S. Appl. No. 12/270,256.
Office Action dated Jun. 8, 2011 for U.S. Appl. No. 12/482,189.
Final Office Action dated Jul. 6, 2011 for U.S. Appl. No. 12/270,256.
Form PCT/ISA/220, Form PCT/ISA/210, and Form PCT/ISA/237 for PCT/IB2010/003373 dated Jun. 14, 2011, which corresponds to U.S. Appl. No. 12/646,191.

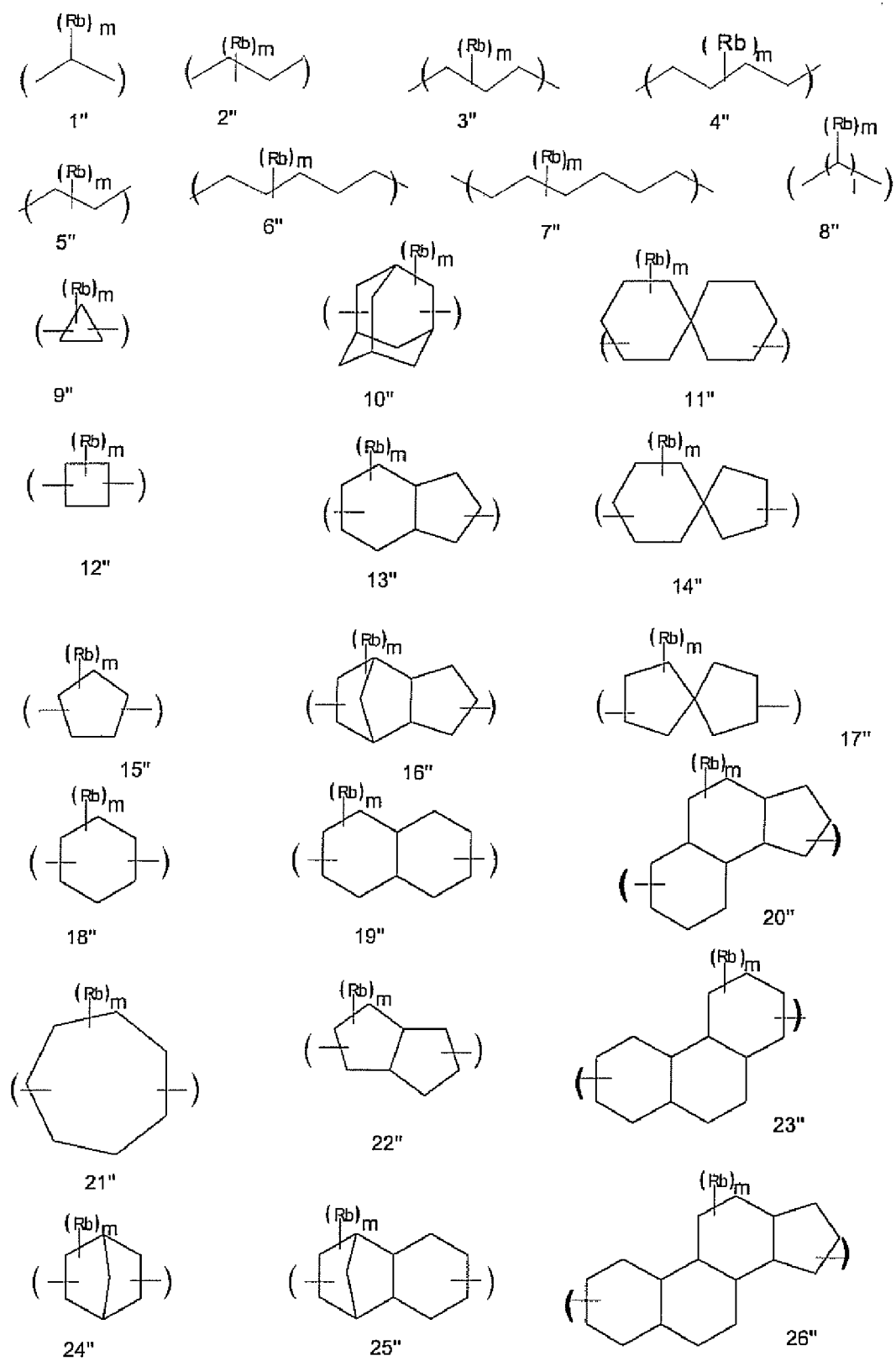
Figure 1: Examples of the aliphatic moiety.

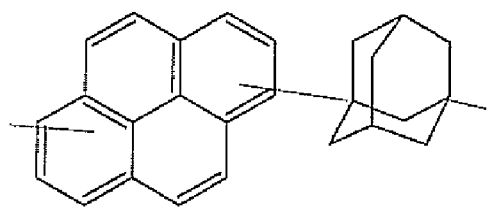
Polymer 1
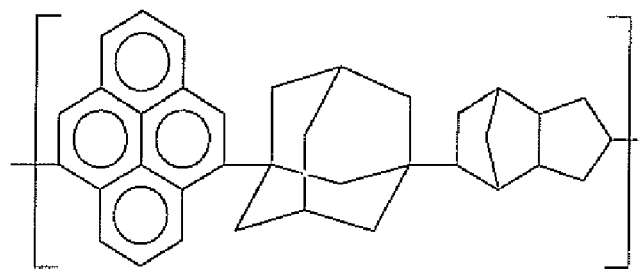
Polymer 2
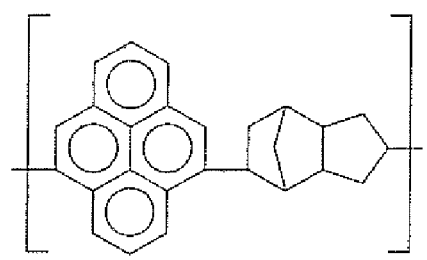
Polymer 3
Figure 2: Examples of the polymeric units

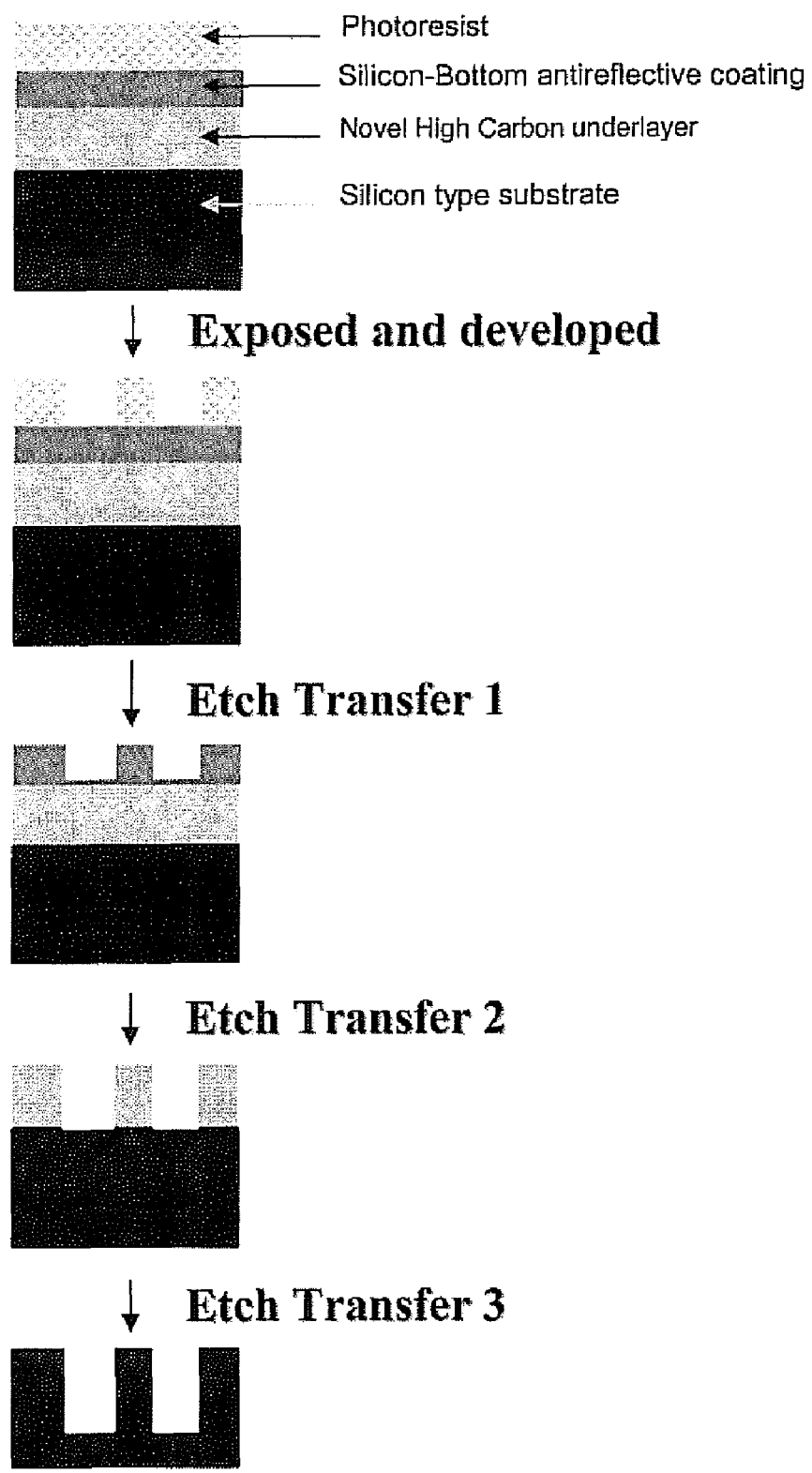
Figure 3: Imaging Process of a Trilayer

# ANTIREFLECTIVE COATING COMPOSITION COMPRISING FUSED AROMATIC RINGS

CROSS-REFERENCE TO RELATED APPLICATION

This application is a continuation-in-part application of Ser. No. 11/752,040 filed May 22, 2007, now-abandoned the contents of which are hereby incorporated herein by reference.

FIELD OF INVENTION

The present invention relates to an absorbing antireflective coating composition comprising a polymer with 3 or more fused aromatic rings in the backbone of the polymer, and a process for forming an image using the antireflective coating composition. The process is especially useful for imaging photoresists using radiation in the deep and extreme ultraviolet (uv) region.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing a organic mask layer with high carbon content beneath the silicon antireflective layer, a very large aspect ratio can be obtained. Thus, the organic high carbon mask layer can be much thicker than the photoresist or silicon layer above it. The organic mask layer can be used as a thicker film and can provide better substrate etch masking that the original photoresist.

The present invention relates to a novel organic spin coatable antireflective coating composition or organic mask underlayer which has high carbon content, and can be used between a photoresist layer and the substrate as a single layer of one of multiple layers. Typically, the novel composition can be used to form a layer beneath an essentially etch resistant antireflective coating layer, such as a silicon antireflective coating. The high carbon content in the novel antireflective coating, also known as a carbon hard mask underlayer, allows for a high resolution image transfer with high aspect ratio. The novel composition is useful for imaging photoresists, and also for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography.

SUMMARY OF THE INVENTION

The present invention relates to an organic spin coatable antireflective coating composition comprising a polymer comprising at least one unit with 3 or more fused aromatic rings in the backbone of the polymer and at least one unit with an aliphatic moiety in the backbone of the polymer. The invention further relates to a process for imaging the present composition.

BRIEF DESCRIPTION OF DRAWINGS

FIG. 1 shows examples of alkylene comonomeric units.
FIG. 2 shows examples of some of the polymers.
FIG. 3 illustrates the process of imaging.

DESCRIPTION OF THE INVENTION

The present invention relates to a novel organic spin coatable mask layer and antireflective coating composition comprising a polymer, where the polymer comprises at least one unit with three or more fused aromatic rings in the backbone of the polymer and at least one unit with an aliphatic moiety in the backbone of the polymer. The invention also relates to a process for imaging a photoresist layer coated above the novel antireflective coating layer.

The novel antireflective coating of the present invention comprises a novel polymer with high carbon content which is capable of crosslinking, such that the coating becomes insoluble in the solvent of the material coated above it. The novel coating composition is capable of self-crosslinking or may additionally comprise a crosslinking compound capable of crosslinking with the polymer. The composition may additionally comprise other additives, such as organic acids, thermal acid generators, photoacid generators, surfactants, other high carbon content polymers etc. The solid components of the novel composition are dissolved in an organic coating solvent composition, comprising one or more organic solvents.

The polymer of the novel composition comprises at least one unit with three or more fused aromatic rings in the backbone of the polymer and at least one unit with an aliphatic moiety in the backbone of the polymer. Other comonomeric units may also be present, such as substituted or unsubstituted phenyl, or substituted or unsubstituted naphthyl. In one embodiment the polymer may be free of any phenyl or single ring aromatic moiety. The fused aromatic rings provide the absorption for the coating, and are the absorbing chromophore. The fused aromatic rings of the polymer can comprise 6 membered aromatic rings which have a common bond to form a fused ring structure, such as units exemplified by structures 1-6 and their isomers,

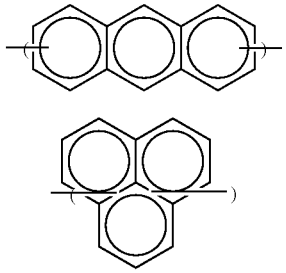
1

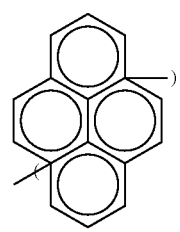
2

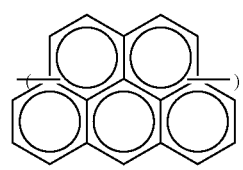
3

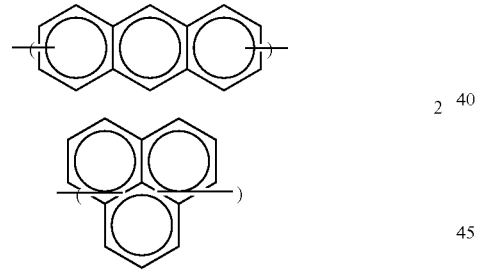
4

-continued

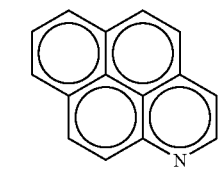
5

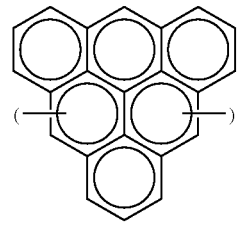
6

The fused rings may be exemplified by anthracene, phenanthrene, pyrene, fluoranthene, and coronene triphenylene.

The fused rings may form the backbone of the polymer at any site in the aromatic structure and the attachment sites may vary within the polymer. The fused ring structure can have more than 2 points of attachment forming a branched oligomer or branched polymer. In one embodiment of the present invention the number of fused aromatic rings may vary from 3-8, and in other embodiment of the polymer it comprises 4 or more fused aromatic rings, and more specifically the polymer may comprise pyrene as shown in structure 3. The fused aromatic rings may comprise one or more hetero-aromatic rings, where the heteroatom may be nitrogen or sulfur, as illustrated by structure 7.

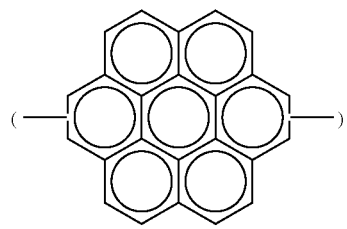
7

In one embodiment of the polymer, in order to isolate the chromophore, the fused aromatic unit is connected to an aliphatic carbon moiety. The fused aromatic rings of the polymer may be unsubstituted or substituted with one or more organo substituents, such as alkyl, alkylaryl, ethers, haloalkyls, carboxylic acid, ester of carboxylic acid, alkylcarbonates, alkylaldehydes, ketones. Further examples of substituents are —CH$_2$—OH, —CH$_2$Cl, —CH$_2$Br, —CH$_2$Oalkyl, —CH$_2$—O—C=O(alkyl), —CH$_2$—O—C=O(O-alkyl), —CH(alkyl)-OH, —CH(alkyl)-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-CO$_2$H, alkyl-C=O(O-alkyl), -alkyl-OH, -alkyl-halo, -alkyl-O—C=O(alkyl), -alkyl-O—C=O(O-alkyl), alkyl-HC=O. In one embodiment of the polymer, the fused aromatic group is free of any pendant moiety containing nitrogen. The substituents on the aromatic rings may aid in the solubility of the polymer in the coating solvent. Some of the substituents on the fused aromatic structure may also be thermolysed during curing, such that they may not remain in the cured coating and may still give a high carbon content film useful during the etching process. The fused aromatic groups are more generally illustrated by structures 1' to 6', where $R_a$ is an organo substituent, such as hydrogen, hydroxy, hydroxy alkylaryl, alkyl, alkylaryl, carboxylic acid, ester of carboxylic acid, etc., and n is the number of substituents on the rings. The substituents, n, may range from 1-12. Typically n can range from 1-5, where Ra, exclusive of hydrogen, is a substituent independently selected from groups such as alkyl, hydroxy, hydroxyalkyl, hydroxyalkylaryl, alkylaryl, ethers, haloalkyls, alkoxy, carboxylic acid, ester of carboxylic acid, alkylcarbonates, alkylaldehydes, ketones. Further examples of substituents are —CH$_2$—OH, —CH$_2$Cl, —CH$_2$Br, —CH$_2$Oalkyl, —CH$_2$—O—C=O(alkyl), —CH$_2$—O—C=O(O-alkyl), —CH(alkyl)-OH, —CH(alkyl)-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-CO$_2$H, alkyl-C=O(O-alkyl), -alkyl-OH, -alkyl-halo, -alkyl-O—C=O(alkyl), -alkyl-O—C=O(O-alkyl), alkyl-HC=O.

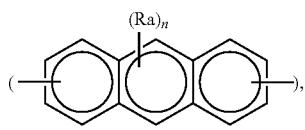
1'

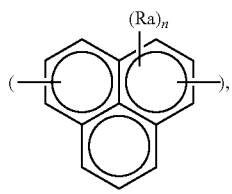
2'

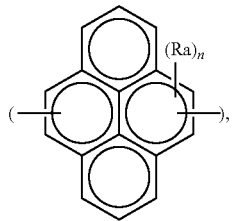
3'

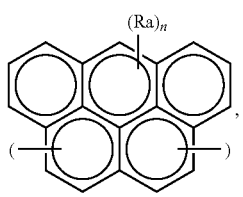
4'

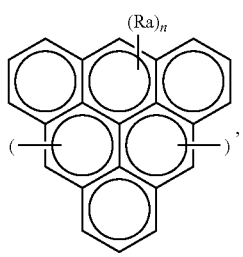
5'

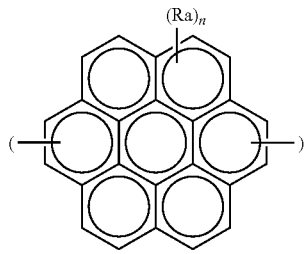
6'

The polymer may comprise more than one type of the fused aromatic structures described herein.

In addition to the fused aromatic unit, the polymer of the novel antireflective coating further comprises at least one unit with an essentially aliphatic moiety in the backbone of the polymer, and the moiety is any that has a nonaromatic structure that forms the backbone of the polymer, such as an alkylene which is primarily a carbon/hydrogen nonaromatic moiety. The polymer can comprise at least one unit which forms only an aliphatic backbone in the polymer, and the polymer may be described by comprising units, -(A)- and -(B)-, where A is any fused aromatic unit described previously, which may be linear or branched, and where B has only an aliphatic backbone. B may further have pendant substituted or unsubstituted aryl or aralkyl groups or be connected to form a branched polymer. The alkylene, aliphatic moiety in the polymer may be selected from a moiety which is linear, branched, cyclic or a mixture thereof. Multiple types of the alkylene units may be in the polymer. The alkylene backbone unit may have some pendant groups present, such as hydroxy, hydroxyalkyl, alkyl, alkene, alkenealkyl, alkylalkyne, alkyne, alkoxy, aryl, alkylaryl, aralkyl ester, ether, carbonate, halo (e.g. Cl, Br). Pendant groups can impart useful properties to the polymer. Some of the pendant groups may be thermally eliminated during curing to give a polymer with high carbon content, for example through crosslinking or elimination to form an unsaturated bond. Alkylene groups such as hydroxyadamantylene, hydroxycyclohexylene, olefinic cycloaliphatic moiety, may be present in the backbone of the polymer. These groups can also provide crosslinking sites for crosslinking the polymer during the curing step. Pendant groups on the alkylene moiety, such as those described previously, can enhance solubility of the polymer in organic solvents, such as coating solvents of the composition or solvents useful for edge bead removal. More specific groups of the aliphatic comonomeric unit are exemplified by adamantylene, dicyclopentylene, and hydroxy adamantylene. The structures of some of the alkylene moieties are given in FIG. 1, where $R_b$ is independently selected from hydrogen, hydroxy, hydroxyalkyl, alkyl, alkylaryl, ethers, halo, haloalkyls, carboxylic acid, ester of carboxylic acid, alkylcarbonates, alkylaldehydes, ketones, and other known substituents, and m is the number of substituents. The number, m, may range from 1-40, depending on the size of the unit. Different or the same alkylene group may be connected together to form a block unit and this block unit may be then connected to the unit comprising the fused aromatic rings. In some cases a block copolymer may be formed, in some case a random copolymer may be formed, and in other cases alternating copolymers may be formed. The copolymer may comprise at least 2 different aliphatic comonomeric units. The copolymer may comprise at least 2 different fused aromatic moieties. In one embodiment the polymer may comprise at least 2 different aliphatic comonomeric units and at least 2 different fused aromatic moieties. In another embodiment of the invention the polymer comprises at least one fused aromatic unit and aliphatic unit(s) free of aromatics. In one embodiment of the unit with the aliphatic group, the cycloalkylene group is selected from a biscycloalkylene group, a triscycloalkylene group, a tetracycloalkylene group in which the linkage to the polymer backbone is through the cyclic structure and these cyclic structures form either a monocyclic, a dicyclic or tricyclic structure. In another embodiment of the polymer, the polymer comprises a unit with the fused aromatic rings and a unit with an aliphatic moiety in the backbone, where the aliphatic moiety is a mixture of unsubstituted alkylene and a substituted alkylene where the substituent may be hydroxy, carboxylic acid, carboxylic ester, alkylether, alkoxy alkyl, alkylaryl, ethers, haloalkyls, alkylcarbonates, alkylaldehydes, ketones and mixtures thereof.

As described herein, alkylene, may be linear alkylene, branched alkylene or cycloaliphatic alkylene (cycloalkylene). Alkylene groups are divalent alkyl groups derived from any of the known alkyl groups and may contain up to about 20-30 carbon atoms. The alkylene monomeric unit can comprise a mixture of cycloalkene, linear and/or branched alkylene units, such as —$CH_2$-cyclohexanyl-$CH_2$—). When referring to alkylene groups, these may also include an alkylene substituted with ($C_1$-$C_{20}$)alkyl groups in the main carbon backbone of the alkylene group. Alkylene groups can also include one or more alkene and or alkyne groups in the alkylene moiety, where alkene refers to a double bond and alkyne refers to a triple bond. The unsaturated bond(s) may be present within the cycloaliphatic structure or in the linear or branched structure, but preferably not in conjugation with the fused aromatic unit. The alkyene moiety may itself be an unsaturated bond comprising a double or triple bond. The alkylene group may contain substituents such as, hydroxy, hydroxyalkyl, carboxylic acid, carboxylic ester, alkylether, alkoxy alkyl, alkylaryl, ethers, haloalkyls, alkylcarbonates, alkylaldehydes, and ketones. Further examples of substituents are —$CH_2$—OH, —$CH_2$Cl, —$CH_2$Br, —$CH_2$Oalkyl, —$CH_2$—O—C=O(alkyl), —$CH_2$—O—C=O(O-alkyl), —CH(alkyl)-OH, —CH(alkyl )-Cl, —CH(alkyl)-Br, —CH(alkyl)-O-alkyl, —CH(alkyl)-O—C=O-alkyl, —CH(alkyl)-O—C=O(O-alkyl), —HC=O, -alkyl-$CO_2$H, alkyl-C=O(O-alkyl), —alkyl-OH, -alkyl-halo, -alkyl-O—C=O(alkyl), -alkyl-O—C=O(O-alkyl), and alkyl-HC=O. In one embodiment the alkylene backbone may have aryl substituents. Essentially an alkylene moiety is at least a divalent hydrocarbon group, with possible substituents. Accordingly, a divalent acyclic group may be methylene, ethylene, n-or iso-propylene, n-iso, or tert-butylene, linear or branched pentylene, hexylene, heptylene, octylene, decylene, dodecylene, tetradecylene and hexadecylene. 1,1- or 1,2-ethylene, 1,1-, 1,2-, or 1,3 propylene, 2,5-dimethyl-3-hexene, 2,5-dimethyl-hex-3-yne, and so on. Similarly, a divalent cyclic alkylene group may be monocyclic or multicyclic containing many cyclic rings. Monocyclic moieties may be exemplified by 1,2- or 1,3-cyclopentylene, 1,2-, 1,3-, or 1,4-cyclohexylene, and the like. Bicyclo alkylene groups may be exemplified by bicyclo[2.2.1]heptyiene, bicyclo[2.2.2]octylene, bicyclo[3.2.1]octylene, bicyclo[3.2.2]nonylene, and bicyclo[3.3.2]decylene, and the like. Cyclic alkylenes also include spirocyclic alkylene in which the linkage to the polymer backbone is through the cyclo or a spiroalkane moiety, as illustrated in structure 8,

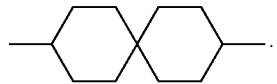

Divalent tricyclo alkylene groups may be exemplified by tricyclo[5.4.0.0.$^{2,9}$]undecylene, tricyclo[4.2.1 2.$^{7,9}$]undecylene, tricyclo[5.3.2.0.$^{4,9}$]dodecylene, and tricyclo[5.2.1.0.$^{2,6}$]decylene. Diadamantyl is an example of an alkylene. Further examples of alkylene moieties are given in FIG. 1, which may be in the polymer alone or as mixtures or repeat units.

The alkyl group is generally aliphatic and may be cyclic or acyclic (i.e. noncyclic) alkyl having the desirable number of carbon atoms and valence Suitable acyclic groups can be methyl, ethyl, n-or iso-propyl, n-,iso, or tert-butyl, linear or branched pentyl, hexyl, heptyl, octyl, decyl, dodecyl, tetradecyl and hexadecyl. Unless otherwise stated, alkyl refers to 1-20 carbon atom moeity. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicyclo[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl groups may have any of the acyclic alkyl groups or aryl groups as substituents.

Aryl groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like.

Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

In a polymer embodiment of the present invention, the polymer comprises at least one unit with 3 or more fused aromatic rings in the backbone of the polymer, at least one unit with an aliphatic moiety in the backbone of the polymer, and at least one unit comprising a group selected from a substituted phenyl, unsubstituted phenyl, unsubstituted biphenyl, substituted biphenyl, substituted naphthyl and unsubstituted naphthyl. The fused aromatic ring with 3 or more aromatic units and the aliphatic moiety are as described herein. The polymer may be free of any pendant moiety containing nitrogen. The polymer may be free of any pendant moiety containing nitrogen, in one embodiment. The substituents on the phenyl, biphenyl and naphthyl may be at least one polar group that increases the solubility of the polymer in a polar solvent, such as ethyl lactate, PGMEA and PGME. Examples of substituents are hydroxy, hydroxyalkyl, halide, etc. The phenyl, biphenyl or naphthyl group may form part of the backbone or be attached to the polymer backbone directly or through a linking group such as a adamantyl group, ethylene group, etc., and where examples of monomeric units may be derived from monomers such as hydroxystyrene, phenol, naphthol, and hydroxynaphthylene. The incorporation of phenol and/or naphthol moieties in the polymer backbone is preferred for films with high carbon content. The amount of the substituted phenyl, unsubstituted phenyl, unsubstituted biphenyl, substituted biphenyl, substituted naphthyl or unsubstituted naphthyl may range from about 5 mole % to about 50 mole % in the polymer, or from about 20 mole % to about 45 mole % in the polymer. Compositions comprising polymers of the present invention which further comprise phenolic and/or naphthol groups are useful when the coating solvent of the composition is PGMEA or a mixture of PGMEA and PGME. Compositions comprising polymers of the present invention which further comprise phenolic and/or naphthol groups are also useful when the excess composition is to be removed with an edgebead remover, especially where the edgebead remover comprises PGMEA or a mixture of PGMEA and PGME. Other edgebead removers comprising ethyl lactate may also be used. In one embodiment the composition comprises a polymer comprising at least one unit with 3 or more fused aromatic rings in the backbone of the polymer, at least one unit with an aliphatic moiety in the backbone of the polymer, and at least one unit comprising a group selected from phenol, naphthol and mixtures thereof. Pyrene, as the fused aromatic moiety, may be used. The composition may further contain a solvent comprising PGMEA. Other additives, as described herein, may be used in the composition.

The polymer of the present novel composition may be synthesized by reacting a) at least one aromatic compound comprising 3 or more fused aromatic rings capable of electrophilic substitution such that the fused rings form the backbone of the polymer, with b) at least one essentially aliphatic compound. The aromatic compound may be selected from monomers that provide the desired aromatic unit, more specifically structures 1-6 or 1'-6' or equivalents, and may be further selected from compounds such as anthracene, phenanthrene, pyrene, fluoranthene, and coronene triphenylene. The fused aromatic rings provide at least 2 reactive hydrogens which are sites for electrophilic substitution. The aliphatic compound is an essentially linear, branched or cyclic substituted or unsubstituted alkyl compound capable of forming the aliphatic unit in the polymer, and also capable of forming a carbocation in the presence of an acid, and may be selected from compounds such as aliphatic diol, aliphatic triol, aliphatic tetrol, aliphatic alkene, aliphatic diene, etc. Any compound that is capable of forming the alkylene unit in the polymer of the novel composition as described previously may be used. The aliphatic monomer may be exemplified by 1,3-adamantanediol, 1,5-adamantanediol, 1,3,5-adamantanetriol, 1,3,5-cyclohexanetriol, and dicyclopentadiene. Other monomers may also be added into the reaction mixture, such as phenol and/or naphthol. The reaction is catalysed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong nonnucleophilic acids. The reaction may be carried out with or without a solvent. If a solvent is used then any solvent capable of dissolving the solid components may be used, especially one which is non-reactive towards strong acids; solvents such as chloroform, bis(2-methoxyethyl ether), nitrobenzene, methylene chloride, and diglyme may be used. The reaction may be mixed for a suitable length of time at a suitable temperature, till the polymer is formed. The reaction time may range from about 3 hours to about 24 hours, and the reaction temperature may range from about 80° C. to about 180° C. The polymer is isolated and purified in appropriate solvents, such as methanol, cyclohexanone, etc., through precipitation and washing. Known techniques of reacting, isolating and purifying the polymer may be used. The weight average molecular weight of the polymer can range from about 1000 to about 50,000, or about 1300 to about 20,000. The refractive indices of the polymer, n (refractive index) and k (absorption) can range from about 1.3 to about 2.0 for the refractive index and about 0.05 to about 1.0 for the absorption at the exposure wavelength used, such as 193 nm. The carbon content of the polymer is greater than 80% as measured by elemental analysis, preferably greater than 85%.

The polymer of the present novel composition may have the structural units shown in FIG. 2.

The novel composition of the present invention comprises the polymer and may further comprise a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple electrophilic sites, are capable of crosslinking with the polymer. Examples of compounds which can be crosslinkers are, 1,3 adamantane diol, 1,3,5 adamantane trio, polyfunctional reactive benzylic compounds, tetramethoxymethyl-bisphenol (TMOM-BP) of structure (9), aminoplast crosslinkers, glycolurils, Cymels, Powderlinks, etc.

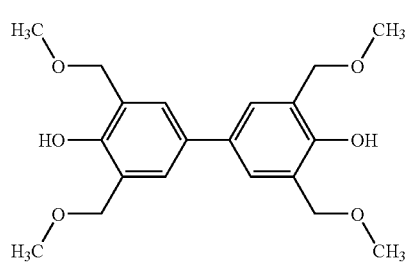

9

The novel composition comprising the polymer may also comprise an acid generator, and optionally the crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylakylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diarlyiodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain at least one of the known photoacid generators, examples of which without limitation, are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

The antireflection coating composition of the present invention may contain 1 weight % to about 15 weight % of the fused aromatic polymer, and preferably 4 weight % to about 10 weight %, of total solids. The crosslinker, when used in the composition, may be present at about 1 weight % to about 30 weight % of total solids. The acid generator, may be incorporated in a range from about 0.1 to about 10 weight % by total solids of the antireflective coating composition, preferably from 0.3 to 5 weight % by solids, and more preferably 0.5 to 2.5 weight % by solids.

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition comprises the polymer, and other components may be added to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel composition ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.05 to about 0.75, and for 248 nm the preferred range for k is about 0.15 to about 0.8.

The carbon content of the novel antireflective coating composition is greater than 80 weight % or greater than 85 weight % as measured by elemental analysis.

The antireflective coating composition is coated on the substrate using techniques well known to those skilled in the art, such as dipping, spin coating or spraying. The film thickness of the antireflective coating ranges from about 15 nm to about 400 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C.

Other types of antireflective coatings may be coated above the coating of the present invention. Typically, an antireflective coating which has a high resistance to oxygen etching, such as one comprising silicon groups, such as siloxane, functionalized siloxanes, silsesquioxanes, or other moieties that reduce the rate of etching, etc., is used so that the coating can act as a hard mask for pattern transference. The silicon coating can be spin coatable or chemical vapor deposited. In one embodiment the substrate is coated with a first film of the novel composition of the present invention and a second coating of another antireflective coating comprising silicon is coated above the first film. The second coating can have an absorption (k) value in the range of about 0.05 and 0.5. A film of photoresist is then coated over the second coating. The imaging process is exemplified in FIG. 3.

A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. Nos. 4,491,628 and 5,350,660. On the other hand, photoresists for exposure at 193 nm and 157 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide (TMAH). The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Example 1

Synthesis of Polymer

A solution was prepared consisting of 1.8157 grams ($8.977 \times 10^{-3}$ moles) of pyrene, 1.51 grams ($8.977 \times 10^{-3}$ moles) of 1,3-adamantanediol and 0.15 grams of triflic acid dissolved in 10 ml of nitrobenzene, which was placed in a round bottomed flask which was purged slowly with nitrogen. The reaction was heated in an oil bath to 100° C. and left to stir at this temperature overnight. After this time the reaction mixture was precipitated into 500 ml of methanol. The recovered solid was air dried and then dissolved into 10 ml of cyclohexanone and precipitated into methanol one more time. The material isolated from this precipitation was dissolved into 10 ml of cyclohexanone and precipitated into 500 ml of hexane. After drying, 1.94 grams of polymer was recovered (58% yield). The polymer had a weight average molecular weight Mw of 2,200 and polydispersity of 2. The Proton NMR was: 1-3.2 ppm (adamantane unit), 7.3-9.2 ppm (pyrene unit), with a ratio of 3.75 to 5 in integration indicating that there was an excess of adamantyl derived units.

A film was spun from a mixture of the polymer and cyclohexanone at 5 weight %, and baked at 110° C. The film had the following optical properties of n=1.68, and k=0.39 at 193 nm.

Example 2

A solution was prepared by using the polymer of example 1 and formulated as a 2.5 wt % solids solution additionally consisting of 3 wt % diphenyliodonium nonaflate (thermal acid generator, TAG) and 10% TMOM-BP (cross-linker), in cyclohexanone. This solution was spin coated at 1,500 rpm for 3 minutes and baked at 250° C. for 1 min. After curing at 250° C. for 1 min, the film was unaffected by cyclohexanone, PGMEA, PGME or a mixture of 70/30 PGMEA and PGME in a 1 minute soak test. However, prior to this cure, edge bead removal can be done with cyclohexanone.

Example 3

Synthesis of Polymer

Pyrene (20.2 g, 0.1 mole), 1,3-adamantane diol (8.41 g, 0.05 mole) and chloroform (100 g) were placed into a 500 ml flask equipped with stirrer, condenser and thermowatch, and mixed for 10 minutes under nitrogen at room temperature. Perfluorobutane sulphonic acid (3.0 g) was added and heated to reflux for 10 hours. Chloroform (100 g) and water (100 g) were added after cooling to room temperature, and 3.65 g of tetramethyl ammonium hydroxide (TMAH) 25% solution in water was also added and stirred for 30 minutes. The reaction mixture was transferred to a separating funnel and extracted with deionized (DI) water three times. The solvent was evaporated using rotary evaporator to very concentrated syrup and drowned into 1.5 liter methanol. A precipitate was formed, and the solid was filtered and dried. The polymer was redissolved in 74 g chloroform and reprecipitated from 1.5 liter hexane, filtered through Buckner funnel and dried in the vacuum oven. The yield was 65%, weight average molecular weight was Mw 1890, and polydispersity was 1.85.

Example 4

A formulation was prepared as a 5 wt % solids solution containing the polymer of example 3 (2.5 g), 1.0 g of dodecylbenzenesulfonic acid (DBSA) as a 10% solution in 70:30 PGMEA:PGME solution and 0.25 g of TMOM-BP (cross-linker), in cyclohexanone. This solution was spun at 1,500 rpm for 3 minutes, and baked at 250° C. for 1 minute. After curing at 250° C. for 1 minute, the film was unaffected by cyclohexanone, PGMEA, PGME or a mixture of 70/30 PGMEA and PGME in a 1 min soak test. However, prior to this cure, edge bead removal can be done with a mixture of 70/30 PGMEA and PGME. Optical properties were measured and found to be n=1.64, and k=0.55 at 193 nm.

Example 5

Synthesis of Polymer

Example 3 was repeated using as the monomers, pyrene (20.2 g, 0.1 mole) and 1,3-adamantane diol (16.8 g, 0.1 mole). The polymer was obtained with a yield of 60% yield, weight average molecular weight Mw of 1857, and polydispersity of 1.9.

Example 6

A formulation was prepared as a 5 wt % solids containing the polymer of example 5 (2.5 g), 1.0 g of DBSA as a 10% solution in 70:30 PGMEA:PGME solution and 0.25g of TMOM-BP (cross-linker), in cyclohexanone. This solution was spun at 1,500 rpm for 3 minutes, baked at 250° C. for 1 minute. After curing the film at 250° C. for 1 min., the film was unaffected by cyclohexanone, PGMEA, PGME or a mixture of 70/30 PGMEA and PGME in a 1 min soak test. However, prior to this cure edge bead removal can be done with a mixture of 70/30 PGMEA and PGME. The optical properties of the film were measured to be n=1.64 and k=0.50 at 193 nm.

Example 7

Synthesis of Polymer

Pyrene (20.2 g, 0.1 mole), 1,3-adamantane diol (8.41 g, 0.05 mole) 2-methoxyethyl ether (150 g) were placed into a 500 ml flask equipped with stirrer, condenser and thermowatch, and mixed for 10 minutes under nitrogen at room temperature. Perfluorobutane sulphonic acid (3.0 g) was added and heated to reflux for 10 hours. The reaction mixture was allowed to cool to room temperature and drowned into 2 liters of methanol. The precipitate was filtered. The polymer was slurried in hexane, filtered and washed with hexane, and dried under vacuum. The dry polymer was dissolved in chloroform and transferred to a separating funnel and then water (500 g) and 3.6 g of TMAH (25% in water) were added. The organic layer was washed with DI water three times. The solution was concentrated by evaporating the chloroform in a rotary evaporator and precipitated from 2.0 liters of hexane, filtered through a Buckner funnel and dried in the vacuum oven. The yield of the polymer was 55%, weight average molecular weight Mw was 1312, and polydispersity was 1.72.

Example 8

A formulation was prepared as a 5 wt % solids containing the polymer of example 7 (2.5 g), 1.0 g of DBSA as a 10% solution in 70:30 PGMEA:PGME solution and 0.25 g of TMOM-BP (cross-linker), in 46.35 g of cyclohexanone. This solution was spun at 1,500 rpm for 3 minutes, and baked at 250° C. for 1 min. After curing the film at 250° C. for 1 min, the film was unaffected by cyclohexanone, PGMEA, PGME or a mixture of 70/30 PGMEA and PGME in a 1 min soak test. However, prior to this cure edge bead removal can be done with a mixture of 70/30 PGMEA and PGME. The optical properties of the film were measured as n=1.64, and k=0.59 at 193 nm.

Example 9

Synthesis of Polymer

Example 7 was repeated with pyrene (20.2 g, 0.1 mole), 1,3-adamantane diol (16.8 g, 0.1 mole) and a polymer was obtained with a yield of 50%, molecular weight Mw 1312, and polydispersity of 1.61.

Example 10

A formulation was prepared as a 5 wt % solids containing polymer of example 9 (2.5 g), 1.0 g of DBSA as a 10% solution in 70:30 PGMEA:PGME solution and 0.25 g of TMOM-BP (cross-linker), in 46.25 g of cyclohexanone. This solution was spun at 1,500 rpm for 3 minutes, baked at 250° C. for 1 min. After curing the film at 250° C. for 1 min, the film was unaffected by cyclohexanone, PGMEA, PGME or a mixture of 70/30 PGMEA and PGME, in a 1 min soak test. However, prior to this cure edge bead removal can be done with a mixture of 70/30 PGMEA and PGME. The optical properties of the film were measured to be n=1.64 and k=0.51 at 193 nm.

Example 11

Synthesis of Polymer

Pyrene (10.2 g~0.05 mole) and 1,3-adamantane diol (AD-diol, 3.0 g~0.017 mole), dicyclopentadiene (DCPD, 6.5 g, 0.05 mole) were placed in a 500 ml, 4 neck round bottomed flask, equipped with stirrer, condenser, Thermo watch and $N_2$ sweep. 150 g of diglyme was added, mixed for 10 minutes under nitrogen and 3.0 g of nonafluorobutane sulphonic acid (PFBS) was added. The flask was heated to reflux at 150° C., for six hours. After the reaction, the flask was cooled to room temperature and 4 g of TMAH (25% in water) was added. The mixture was stirred for an hour and drowned into 3 liters of methanol; a precipitate formed, which was filtered through a Buckner Funnel, washed with hexane and dried under vacuum to give 9.8 g of the polymer (50% yield). Results are shown in Table-1.

Optical Measurements: 0.125 g of polymer (from example 11) and 9.875 g of cyclohexanone were weighed into a 20 ml vial. The mixture was allowed to mix until all the materials become soluble. The homogeneous solution was filtered with 0.2 µm membrane filter. This filtered solution was spin-coated on a 4" silicon wafer at 2000 rpm. The coated wafer was baked on a hotplate at 250° C. for 60 seconds. Then, n and k values were measured with a VASE Ellipsometer manufactured by J. A. Woollam Co. Inc. The optical constants n and k of the film were 1.63 and 0.37 respectively for 193 nm radiation.

Example 12

Synthesis of Polymer

Pyrene (20.2 g~0.1 mole) and 1,3-adamantane diol (AD-diol, 3.30 g~0.02 mole), dicyclopentadiene (DCPD, 13.2 g, 0.05 mole) were taken in a 500 mL 4 neck round bottomed flask, equipped with stirring, condenser, Thermo watch and $N_2$ sweep. 150 g of diglyme was added, mixed for 10 minutes under nitrogen and 3.0 g of nonafluorobutane sulphonic acid was added. The flask was heated to reflux at 150° C., for six hours. The reaction mixture was added to 3 liters of methanol while stirring and was allowed to mix for an hour. A precipitate was formed, filtered through Buckner Funnel, and dried under vacuum. The crude polymer was isolated. The crude polymer was dissolved in 100 ml of chloroform and 4 g of TMAH (25% in water) was added and washed with water three times. The organic layer was collected and the chloroform was evaporated under vacuum and the polymer re-dissolved in a minimum amount of chloroform and drowned into 4 liters of hexane. A precipitate was formed and separated by Buckner funnel, washed with hexane and dried under vacuum, to give a 33% yield. The results are shown in Table 1.

Optical Measurement: 0.125 g of polymer and 9.875 g of cyclohexanone were weighed into a 20 ml vial. The mixture was allowed to mix until all the materials become soluble. The homogeneous solution was filtered with 0.2 µm membrane filter. This filtered solution was spin-coated on a 4" silicon wafer at 2000 rpm. The coated wafer was baked on a hotplate at 250° C. for 60 seconds. Then, n and k values were measured with a VASE Ellipsometer manufactured by J. A. Woollam Co. Inc. The optical constants n and k of the film were 1.62 and 0.34 respectively for 193 nm radiation.

Table 1 provides a summary of the synthesis and results for Example 11 and 12.

TABLE 1

Synthesis, preparation and results for Example 11 and 12

| Example | Pyrene | AD-diol | DCPD | Acid | Mw/pd | Yield | n/k |
|---|---|---|---|---|---|---|---|
| 11 | 0.05 mole | 0.017 mole | 0.05 mole | PFBS | 3358/3.31 | 50% | 1.63/0.37 |
| 12 | 0.1 mole | 0.02 mole | 0.1 mole | PFBS | 5240/4.54 | 33% | 1.62/0.34 |

Mw/pd - weight average molecular weight/polydispersity

Example 13

Soak Test: 1.00 g polymer (from example 11), 0.1 g TMOM-BP, 0.4 g of dodecylbenzenesulfonic acid:triethylamine salt (DBSA:E, TAG) as a 10% solution in 70:30 PGMEA:PGME, 18.5 g cyclohexanone were weighed into a 30 ml vial. The mixture was allowed to mix until all the materials become soluble. The homogeneous solution was filtered with 0.2 µm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness. As a result of effective crosslinking, no film loss was observed.

Example 14

Soak Test: 1.00 g polymer (from example 12), 0.1 g TMOM-BP, 0.4 g of DBSA:E TAG as a 10% solution in 70:30 PGMEA:PGME and 18.5 g cyclohexanone were weighed into a 30 ml vial. The mixture was allowed to mix until all the materials became soluble. The homogeneous solution was filtered with 0.2 µm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer are examined for changes in film thickness. As a result of effective crosslinking, no film loss is observed.

Example 15

Synthesis of Polymer

Pyrene (20.2 g~0.1 mole) and dicyclopentadiene (DCPD 6.61 g, 0.05 mole) were taken in a 500 mL 4 neck round bottomed flask, equipped with stirrer, condenser, Thermo watch and $N_2$ sweep. 150 g of diglyme was added, mixed for 10 minutes under nitrogen and 3.0 g of nonafluorobutane sulphonic acid was added. The flask was heated to reflux at 150° C., for six hours. The reaction mixture was added to 3 liters of methanol while stirring and was allowed to mix for an hour. A precipitate was formed, filtered through Buckner Funnel, dried under vacuum. The crude polymer was isolated. The crude polymer was dissolved in 100 ml of chloroform and 2 g of TMAH (25% in water) was added and washed with water three times. The organic layer was collected and the chloroform was evaporated under vacuum and re-dissolved in a minimum amount of chloroform and drowned into 4 liters of hexane. The precipitate was separated by Buckner funnel, washed with hexane and dried under vacuum, to give a 33% yield. The results are shown in Table 2.

Optical Measurements: 0.125 g of the above polymer and 9.875 g of cyclohexanone were weighed into a 20 ml vial. The mixture was allowed to mix until all the materials become soluble. The homogeneous solution was filtered with 0.2 μm membrane filter. This filtered solution was spin-coated on a 4" silicon wafer at 2000 rpm. The coated wafer was baked on a hotplate at 250° C. for 60 seconds. Then, n and k values were measured with a VASE Ellipsometer manufactured by J. A. Woollam Co. Inc. The optical constants n and k of the film were 1.58 and 0.29 respectively for 193 nm radiation.

Example 16

Synthesis of Polymer

Example 15 was repeated with 0.1 mole of pyrene, and the results are given in Table 2, for Example 15 and 16.

TABLE 2

Synthesis, preparation and results for Example 15 and 16

| Example | Pyrene | DCPD | Acid | Mw/pd | Yield | n & k |
| --- | --- | --- | --- | --- | --- | --- |
| 15 | 0.05 mole | 0.05 mole | PFBS | 5824/2.03 | 15% | 1.58/0.29 |
| 16 | 0.1 mole | 0.05 mole | PFBS | 5244/1.85 | 15% | 1.58/0.29 |

Example 17

Soak Test: 1.00 g polymer (from example 15), 0.1 g TMOM-BP, 0.4 g of DBSA:E TAG as a 10% solution in 70:30 PGMEA:PGME and 18.5 g cyclohexanone were weighed into a 30 ml vial. The mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer are examined for changes in film thickness. With effective crosslinking, no film loss was observed.

Example 18

Soak Test: 1.00 g polymer (from example 16), 0.1 g TMOM-BP, 0.4 g of DBSA:E TAG as a 10% solution and 18.5 g cyclohexanone were weighed into a 30 ml vial. The mixture was allowed to mix until all the materials became soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer are examined for changes in film thickness. With effective crosslinking, no film loss is observed.

A soak test in the solvents, as done in the Examples above, shows that the novel coating film is crosslinked and insoluble in the typical solvents used to form the coating of the layer coated above the novel layer. The photoresist can be coated above the antireflective coating(s) and imaged. The antireflective coating(s) can then be dry etched.

Example 19

Blanket etch rates of the coatings of the antireflective coatings were measured on a NE-5000 N (ULVAC) using both an oxidative and a fluorocarbon-rich etch condition outlined in Table 3. The antireflective coating films (Example 10 and 13) and the 193 nm photoresist AZ® AX1120P (available from AZ® Electronic Materials, Somerville, N.J., USA) with about 250 nm thickness were coated on 8 in silicon wafers, baked at 240° C. for 1 minute. Individual film thickness measuring programs on a Nanospec 8000 using Cauchy's material-dependent constants derived by VASE analysis of the films and a 5 point inspection were performed before and after a 20 second etch. Etch rates were then calculated by taking the film thickness difference divided by etch times.

Etch rate masking potential is revealed in the etch rate data in Table 4 and 5 below. Both pyrene resins reveal they are much more etch resistant over 193 nm photoresist.

TABLE 3

Etch conditions used in the blanket etch rate studies

| Etch condition | Oxidative condition | Fluorocarbon condition |
| --- | --- | --- |
| Gas | $Cl_2/O_2/Ar$, 24/6/25 SCCM | $CF_4/O_2/Ar$, 50/20/150 SCCM |
| Process Pressure | 1.6 Pa | 5 Pa |

Plate temperature: 20° C.;
RF power: 500 W with 50 W bias.

TABLE 4

Etch rate using Oxidative condition.

| Formulation | Etch rate (A/min) | Relative etch rate |
| --- | --- | --- |
| Example 10 | 1127.167 | 0.57 |
| Example 13 | 1159.233 | 0.58 |
| AX1120P | 1986.367 | 1.00 |

TABLE 5

Etch rate using Fluorocarbon condition

| Formulation | Etch rate (A/min) | Relative etch rate |
| --- | --- | --- |
| Example 10 | 1998.844 | 0.76 |
| Example 13 | 2099.333 | 0.80 |
| AX1120P | 2625.2 | 1.00 |

Example 20

Lithography

A 8 in wafer coated with 500 nm of chemically vapor deposited $SiO_2$ is coated with 300 nm of coating from example 10 using the same process conditions as outlined in the example for film preparation. S14, a silicon containing bottom antireflective coating, is coated over the coating from Example 10, and baked at 240° C. for 60 seconds to cure. AZ ArF1120P photoresist is then coated on top and soft baked at 100° C. for 30 seconds. The photoresist is exposed imagewise using a 193 nm exposure tool, baked to amplify the latent image at 120° C. and then developed in 0.26N aqueous TMAH solution.

Etch

The image is transferred into the SiO$_2$ by performing three image transfer etch steps. The first is image transfer from the photoresist into the Si— bottom antireflective coating which uses a fluorocarbon type of etch chemistry which can be similar to the fluorocarbon condition in Table 3. The second is transfer of the Si— bottom antireflective coating image into the pyrene coating of Example 10, which uses an oxygen etch chemistry which can be similar to the fluorocarbon condition in Table 3. The last transfer is from the pyrene coating into the SiO$_2$ substrate and uses a fluorocarbon type of etch chemistry similar to fluorocarbon condition in Table 3. In between transfer steps a mild isotropic strip of the previous mask may be done.

Example 21

Synthesis of Poly(pyrene-co-phenol-co-adamantanediol)

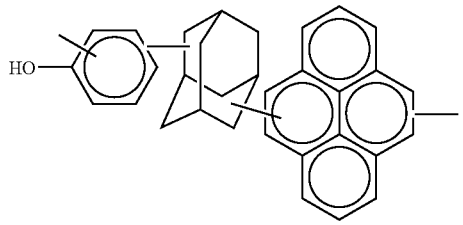

Pyrene (20.25 g~0.1 mole), 1,3-adamantane diol (16.8 g~0.1 mole), and phenol (9.41 g~0.1 mole) were taken in a 500 mL 4Neck round bottom flask, equipped with stirrer, condenser, Dean Stark trap, Thermo watch and N$_2$ sweep. 140 g of diglyme and 40 g of cyclopentyl methyl ether were added, mixed for 10 minutes under nitrogen and 1.50 g of trifluoromethane sulphonic acid were added. The flask was heated to reflux at 140° C., for three hours. After the reaction, the flask was cooled to room temperature. The reaction mixture was drowned into 1.4 liters of methanol, a precipitate formed which was filtered through a Buckner Funnel and dried under vacuum. The crude polymer was redissolved in cyclopentyl methyl ether and washed with water three times and then mixed with 1.5 liters of hexane and a precipitate was formed. The mixture was filtered, washed with hexane and dried under vacuum, 9.8 g of polymer was formed with a 45% yield.

Examples 22 and 23

The reaction was repeated as in Example 21 with different concentration of the monomers as shown in Table 6.

Examples 24 to 26

N & K Measurements for Polymer Examples 21-23: 0.125 g of polymer (from example 21 to 23) and 9.875 g of ArF Thinner(70:30 PGMEA:PGME) were weighed into a 20 mL vial. The mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. Then, n and k values were measured with a VASE Ellipsometer manufactured by J. A. Woollam Co. Inc. The optical constants n and k of the film for 193 nm radiation are shown in Table 6, n/k column.

Soak Test for crosslinking check for compositions: 1.00 g polymer (prepared separately from example 21 to 23), 0.1 g TMOM, 0.4 g of DBSA:E TAG as a 10% solution and 18.5 g ArF thinner were weighed into a 30 mL vial. The mixture was allowed to mix until all the materials become soluble. The homogeneous solution was filtered with 0.2 μm membrane filter. This filtered solution was spin-coated on a 4" silicon wafer at 2000 rpm. The coated wafer was baked on hotplate at 250° C. for 60 seconds. After bake, the wafer was cooled to room temp and partially submerged in PGME for 30 seconds. The two halves of the wafer were examined for changes in film thickness, No film loss was observed in the films exposed to PGMEA of Examples 21-23, thus there was effective crosslinking of the film.

Example 27

Synthesis of Poly(Pyrene-co-1-Naphthol-co-Adamantanediol)

Pyrene (20.25 g~0.1 mole) and 1,3-adamantane diol (16.8 g~0.1 mole), 1-naphthol (14.4 g~0.1 mole) were taken in a 500 mL 4neck round bottomed flask, equipped with stirrer, condenser, Dean Stark trap, Thermo watch and N$_2$ sweep. 140 g of diglyme and 40 g of cyclopentyl methyl ether were added, mixed for 10 minutes under nitrogen and 1.50 g of trifluoromethane sulphonic acid were added. The flask was heated to reflux at 140° C., for three hours. After the reaction, the flask was cooled to room temperature. The reaction mixture was mixed with 1.4 liters of methanol and a precipitate was formed. The precipitate was filtered through a Buckner Funnel and dried under vacuum. The crude polymer was redissolved in cyclopentyl methyl ether, washed with water three times and then mixed in 1.5 liters of hexane. A precipitate was formed, filtered, washed with hexane and dried under vacuum, 24.3 g of the polymer was obtained with a yield of 47% yield. The polymer had a weight average molecular weight, Mw, of 2204 and polydispersity of 2.02.

Example 28

Synthesis of Poly(Pyrene-co-1-Naphthol-co-Phenol-co-Adamantane diol)

Pyrene (10.1 g~0.05 mole) and 1,3-adamantane diol (16.8 g~0.1 mole), 1-naphthol (7.2 g~0.0.05 mole) and phenol 9.4

TABLE 6

(Pyrene/Adamantanediol/Phenol) polymer

| Example/Polymer Example | Pyrene | Phenol | AD-Diol | Mw/Pd | Yield (%) | n/k | Polymer Solubility in ArF Thinner |
|---|---|---|---|---|---|---|---|
| 24/21 | 0.1 mole | 0.1 mole | 0.1 mole | 2521/1.6 | 45 | 1.50/0.55 | good |
| 25/22 | 0.1 mole | 0.1 mole | 0.1 mole | 5085/2.5 | 59 | 1.52/0.57 | good |
| 26/23 | 0.25 mole | 0.25 mole | 0.25 mole | 3660/1.81 | 54 | 1.52/0.58 | good |

ArF Thinner is 70:30 PGMEA:PGME g (0.1 mole) were taken into a 500 mL 4neck round bottomed flask equipped with stirrer, condenser, Dean Stark trap, Thermo watch and $N_2$ sweep. 140 g of diglyme and 40 g of cyclopentyl methyl ether were added, mixed for 10 minutes under nitrogen and 1.50 g of trifluoromethane sulphonic acid was added. The flask was heated to reflux at 140° C., for three hours. After the reaction, the flask was cooled to room temperature. The reaction mixture was mixed with 1.4 liters of methanol and a precipitate was formed. The precipitate was filtered through a Buckner Funnel and dried under vacuum. The crude polymer was redissolved in cyclopentyl methyl ether, washed with water three times and then drowned in 1.5 liters of hexane. A precipitate was formed, filtered, washed with hexane and dried under vacuum. 16.0 g of the polymer was obtained with a yield of 37%, and the weight average molecular weight, Mw, was 3509 with a polydispersity of 1.49.

Example 29

Synthesis of Poly(Anthracene-co-1-Naphthol-co-Phenol-co-Adamantane diol)

Anthracene (8.9 g~0.05 mole) and 1,3-adamantane diol (16.8 g~0.1 mole), 1-naphthol (7.2 g~0.1 mole) and phenol (9.4 g 0.1 mole) were taken into a 500 mL 4neck round bottomed flask equipped with stirrer, condenser, Dean Stark trap, Thermo watch and $N_2$ sweep. 140 g of diglyme and 40 g of cyclopentyl methyl ether were added, mixed for 10 minutes under nitrogen and 1.50 g of trifluoromethane sulphonic acid was added. The flask was heated to reflux at 140° C., for three hours. After the reaction, the flask was cooled to room temperature. The reaction mixture was mixed with 1.4 liters of methanol and a precipitate was formed. The precipitate was filtered through a Buckner Funnel and dried under vacuum. The crude polymer was redissolved in cyclopentyl methyl ether, washed with water three times and then drowned in 1.5 liters of hexane. A precipitate was formed, filtered, washed with hexane and dried under vacuum. 20.0 g of the polymer was obtained with a yield of 50%, and the weight average molecular weight, Mw, was 2946, with a polydispersity of 1.57.

Examples 30 to 32

The composition and process of Examples 24 to 26 was repeated, using polymers from examples 27, 28, and 29. N&k measurement and soak test were performed. The results are shown in Table 7.

TABLE 7

Polymer of examples 27-29

| Example/Polymer Example | Mw/Pd | Yield (%) | n/k | Soak test | Polymer Solubility in ArF Thinner |
|---|---|---|---|---|---|
| 30/27 | 2204/2.02 | 47 | 1.52/0.37 | Good | good |
| 31/28 | 3509/1.49 | 37 | 1.47/0.50 | Good | good |
| 32/29 | 2946/1.57 | 50 | 1.47/0.47 | Good | good |

Good in soak test means effective crosslinking of the film

The invention claimed is:

1. An organic spin coatable antireflective coating composition comprising a polymer comprising at least one unit with 3 or more fused aromatic rings in the backbone of the polymer and at least one unit with an cycloaliphatic moiety in the backbone of the polymer, further where the 3 or more fused aromatic rings are directly bonded to the cycloaliphatic moiety.

2. The composition of claim 1, where the unit with the fused aromatic rings has in the range of 3 to 8 aromatic rings.

3. The composition of claim 1, where the unit with the fused aromatic rings has 4 or more aromatic rings.

4. The composition of claim 1, where the unit with the fused aromatic rings is pyrene.

5. The composition of claim 1, where the unit with the fused aromatic rings is selected from

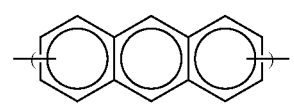

1

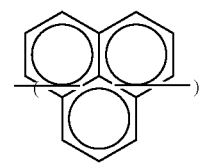

2

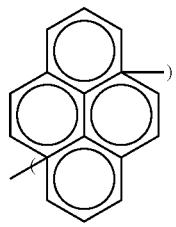

3

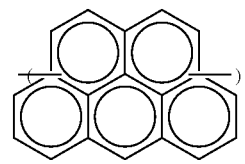

4

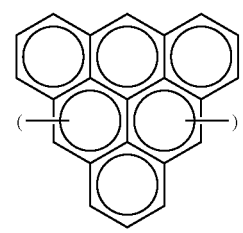

5

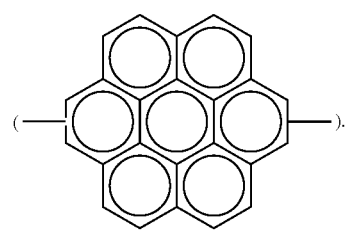

6

6. The composition of claim 1, where the unit with the fused aromatic rings is selected from,

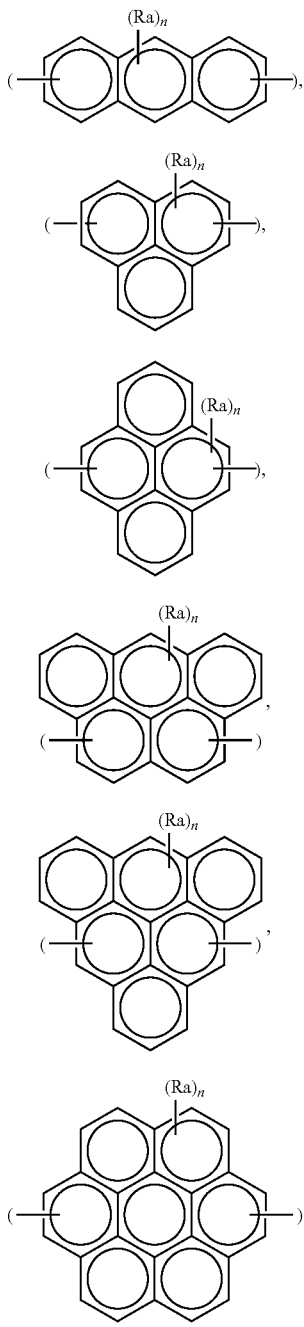

where $R_a$, is an organo substituent, and n is 1-12.

7. The composition of claim 1 where the cycloaliphatic moiety is substituted with at least one group selected from a hydroxy, hydroxyalkyl, hydroxyalkylaryl, carboxylic acid, carboxylic ester, alkylether, alkoxy alkyl, alkylaryl, ethers, haloalkyls, alkylcarbonates, alkylaldehydes, and ketones.

8. The composition of claim 1, where the cycloaliphatic moiety comprises a cycloalkene group.

9. The composition of claim 1 where the polymer comprises at least one pyrene group and at least one adamantylene or cyclopentylene group.

10. The composition of claim 1, where the cycloaliphatic moiety is a mixture of unsubstituted alkylene and a substituted alkylene.

11. The composition of claim 1, where the cycloaliphatic group forms a block unit comprising more than 1 cycloaliphatic unit.

12. The composition of claim 1, where the polymer further comprises a monomeric unit comprising a group selected from at least one of unsubstituted phenyl, substituted phenyl, unsubstituted naphthyl and substituted naphthyl.

13. The composition of claim 1, where the polymer further comprises a monomeric unit comprising a group selected from at least one of unsubstituted phenol, substituted phenol, unsubstituted naphthol, substituted naphthol, unsubstituted biphenyl and substituted biphenyl.

14. The composition of claim 1, where the polymer is free of nitrogen containing pendant groups.

15. The composition of claim 1, where the unit with the aliphatic moiety has sites which can react with a crosslinker.

16. The composition of claim 1, where the composition is not photoimageable.

17. The composition of claim 1, where the composition further comprises a crosslinker.

18. The composition of claim 1, where the composition further comprises an acid generator.

19. A process for manufacturing a microelectronic device, comprising;
a) providing a substrate with a first layer of an antireflective coating composition from claim 1;
b) optionally, providing at least a second antireflective coating layer over the first antireflective coating composition layer;
b) coating a photoresist layer above the antireflective coating layers;
c) imagewise exposing the photoresist layer;
d) developing the photoresist layer with an aqueous alkaline developing solution.

20. The process of claim 17, where the first antireflective coating layer has k value in the range of about 0.05 to about 1.0.

21. The process of claim 17, where the second antireflective coating comprises silicon.

22. The process of claim 17, where the second antireflective coating layer has k value in the range of about 0.05 to about 0.5.

23. The process of claim 17, where the photoresist is imageable with radiation from about 240 nm to about 12 nm or nanoimprinting.

24. An organic spin coatable antireflective coating composition comprising a polymer comprising at least one unit with 3 or more unsubstituted fused aromatic rings in the backbone of the polymer and at least one unit with a cycloaliphatic moiety in the backbone of the polymer.

25. The composition of claim 24, where the polymer further comprises a monomeric unit comprising a group selected from at least one of unsubstituted phenol, substituted phenol, unsubstituted naphthol, substituted naphthol, unsubstituted biphenyl and substituted biphenyl.

* * * * *